(12) United States Patent
Saito

(10) Patent No.: US 6,268,809 B1
(45) Date of Patent: Jul. 31, 2001

(54) DATA COMPRESSION METHOD FOR EFFICIENTLY COMPRESSING DATA BASED ON DATA PERIODICITY

(75) Inventor: Akira Saito, Fuchu (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/355,762

(22) PCT Filed: Dec. 4, 1998

(86) PCT No.: PCT/JP98/05496

§ 371 Date: Aug. 4, 1999

§ 102(e) Date: Aug. 4, 1999

(30) Foreign Application Priority Data

Dec. 5, 1997 (JP) .................................................. 9-335577

(51) Int. Cl.⁷ .................................................. H03M 7/30
(52) U.S. Cl. .............................. 341/51; 341/87; 382/232
(58) Field of Search ......................... 341/51, 87; 382/232, 382/239

(56) References Cited

U.S. PATENT DOCUMENTS

| | | | |
|---|---|---|---|
| 4,558,302 | 12/1985 | Welch | 340/347 DD |
| 5,003,307 | 3/1991 | Whiting et al. | 341/51 |
| 5,046,122 * | 9/1991 | Nakaya et al. | 382/56 |
| 5,694,125 | 12/1997 | Owsley et al. | 341/50 |
| 5,710,719 * | 1/1998 | Houle | 364/514 R |
| 5,883,975 | 3/1999 | Narita et al. | 382/232 |

FOREIGN PATENT DOCUMENTS

| | | |
|---|---|---|
| 60-116228 | 6/1985 | (JP). |
| 3-68219 | 3/1991 | (JP). |
| 8-130652 | 5/1996 | (JP). |
| 9-181610 | 7/1997 | (JP). |
| WO 97/150014 * | 4/1997 | (WO). |

* cited by examiner

*Primary Examiner*—Howard L. Williams
(74) *Attorney, Agent, or Firm*—Foley & Lardner

(57) ABSTRACT

This invention provides a data compression method for efficiently compressing data based on data periodicity. To compress an input data stream and output the encoded stream, encoded input data is stored in a moving window having a predetermined size. A partial sequence starting from a given position (entry) in the moving window is compared with a data sequence to be encoded by a plurality of comparators. An entry having a maximum matching length is found by a matching finder in comparison by the plurality of comparators. When matching is found by the matching finder, a pair of offsets up to the entry and a matching length (offsets and matching length) are encoded by a matching code generator. The number of comparators is smaller than the size of the moving window, and some of offsets near offset 0 (0 indicates including no offset), offsets near offset L, offsets near offset 2L, offsets near offsets 3L, . . . are used as entries.

25 Claims, 14 Drawing Sheets

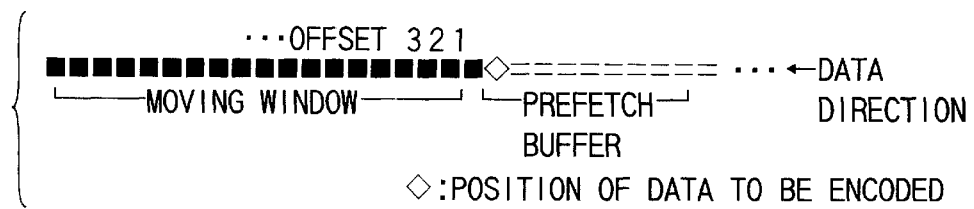
FIG. 3 PRIOR ART
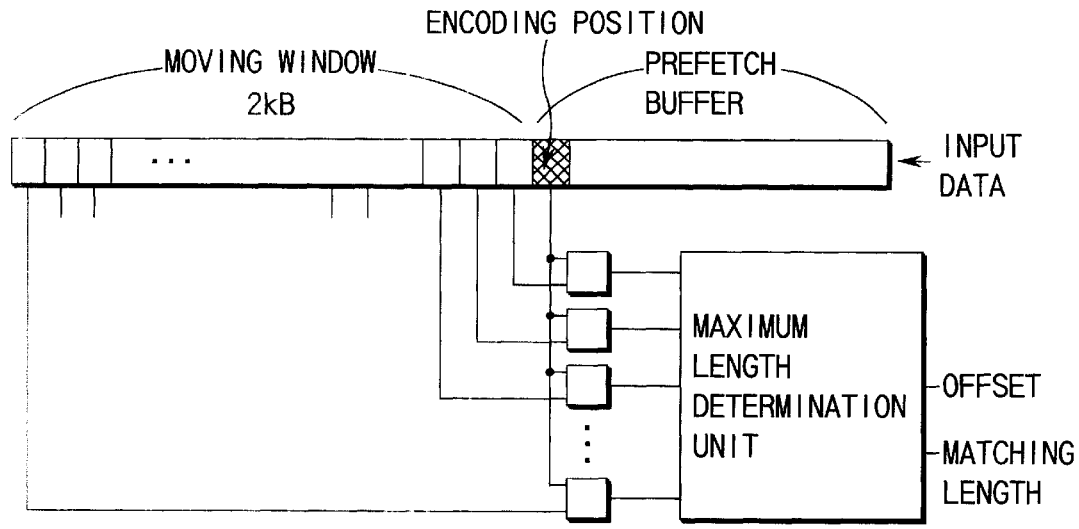
FIG. 4 PRIOR ART
| COMPARATOR NUMBER CMP | OFFSET (FIRST EMBODIMENT) L:LINE LENGTH | OFFSET (SECOND EMBODIMENT) L:LINE LENGTH |
| --- | --- | --- |
| 1 | L | L |
| 2 | 1 | 2 |
| 3 | L+1 | L+2 |
| 4 | L−1 | L−2 |
| 5 | 2 | 4 |
| 6 | L+2 | L+4 |
| 7 | L−2 | L−4 |
| 8 | 3 | 6 |
| 9 | L+3 | L+6 |
| 10 | L−3 | L−6 |
| 11 | 4 | 8 |
| 12 | L+4 | L+8 |
| 13 | L−4 | L−8 |
| 14 | 5 | 10 |
| 15 | L+5 | L+10 |
| 16 | L−5 | L−10 |
FIG. 5

FIG. 6A
FIG. 6B
FIG. 6C
FIG. 6D
FIG. 7A
FIG. 7B

· VERTICALLY SUBSCAN TWO LINES WITHOUT REARRANGING BITS IN BYTE (1) PRE-PROCESSING INPUT ORDER

| 1 | 2 | 3 | 100 |
|---|---|---|---|
| 101 | 102 | 103 | 200 |
| 201 | | | |

FIG. 14A

(2) READOUT ORDER FROM PRE-PROCESSING BUFFER

| *1* | 3 | 5 | *199* |
|---|---|---|---|
| 2 | 4 | 6 | *200* |
| 201 | | | |

FIG. 14B

(3) PRE-PROCESSING OUTPUT ORDER

| *1* | 2 | 3 | 200 |
|---|---|---|---|
| 201 | | | |

FIG. 14C

· VERTICALLY SUBSCAN FOUR LINES WITHOUT REARRANGING BITS IN BYTE (2) READOUT ORDER FROM PRE-PROCESSING BUFFER

| *1* | 5 | | 397 |
|---|---|---|---|
| 2 | 6 | | 398 |
| 3 | 7 | | 399 |
| 4 | 8 | | 400 |
| 401 | | | |

FIG. 15A

(3) PRE-PROCESSING OUTPUT ORDER

| *1* | 2 | 3 | 400 |
|---|---|---|---|
| 201 | | | |

FIG. 15B

· VERTICALLY SUBSCAN EIGHT LINES WITHOUT REARRANGING BITS IN BYTE
(2) READOUT ORDER FROM PRE-PROCESSING BUFFER

| 1 | 9 | | 793 |
|---|---|---|---|
| 2 | 10 | | 794 |
| 3 | 11 | | 795 |
| 4 | 12 | | 796 |
| 5 | 13 | | 797 |
| 6 | 14 | | 798 |
| 7 | 15 | | 799 |
| 8 | 16 | | 800 |
| 801 | | | |

(3) PRE-PROCESSING OUTPUT ORDER

| 1 | 2 | 3 | 800 |
|---|---|---|---|
| 801 | | | |

· REARRANGE INTO RECTANGULAR BLOCK OF 4×2 BITS
  (THE NUMBERS OF BITS IN HORIZONTAL AND VERTICAL DIRECTIONS)
  (2) READOUT ORDER FROM PRE-PROCESSING BUFFER

| ①②③④<br>⑤⑥⑦⑧ | 2 | 3 | 4 | 5 | 6 | | 200 |
|---|---|---|---|---|---|---|---|
| 201 | 202 | 203 | 204 | 205 | 206 | | 400 |
| 401 | | | | | | | |

FIG. 18A (3) PRE-PROCESSING OUTPUT ORDER

| ①②③④⑤⑥⑦⑧ | 2 | 3 | | 200 |
|---|---|---|---|---|
| 201 | | | | |

FIG. 18B

· REARRANGE INTO RECTANGULAR BLOCK OF 2×4 BITS
  (2) READOUT ORDER FROM PRE-PROCESSING BUFFER

| ①②<br>③④<br>⑤⑥<br>⑦⑧ | 2 | 3 | 4 | | 399 | 400 |
|---|---|---|---|---|---|---|
| 401 | 402 | | | | | |

FIG. 19A (3) PRE-PROCESSING OUTPUT ORDER

| ①②③④⑤⑥⑦⑧ | 2 | 3 | | 400 |
|---|---|---|---|---|
| 401 | | | | |

FIG. 19B

- REARRANNGE INTO RECTANGULAR BLOCK OF 1×8 BITS
  (2) READOUT ORDER FROM PRE-PROCESSING BUFFER

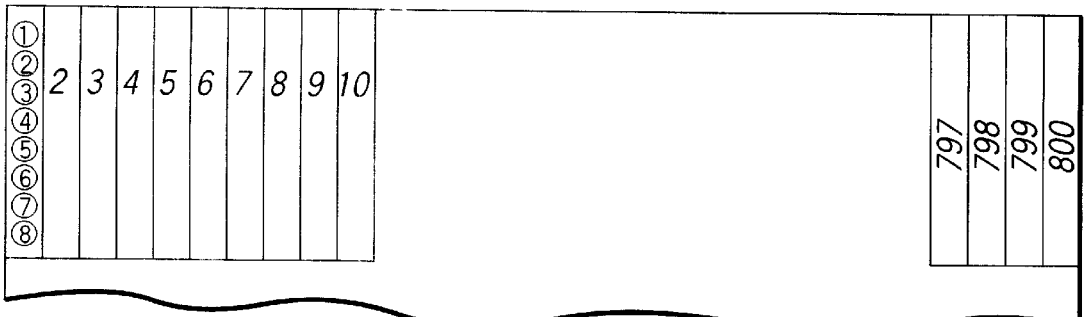

FIG. 20A (3) PRE-PROCESSING OUTPUT ORDER

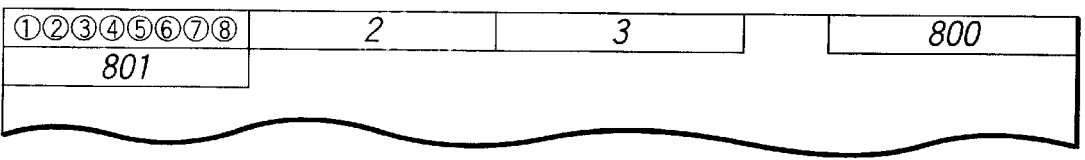

FIG. 20B

- ARRANGE LUMINANCE BYTES AND COLOR DIFFERENCE BYTES, RESPECTIVELY, IN FIRST AND SECOND HALVES WITHIN LINE
  (1) PRE-PROCESSING INPUT ORDER

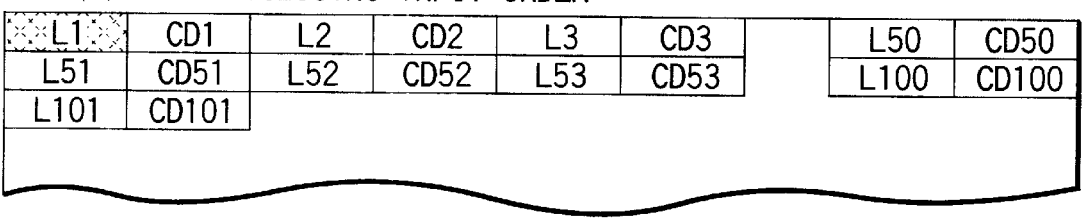

FIG. 22A    L:LUMINANCE    CD:COLOR DIFFERENCE (2) READOUT ORDER FROM PRE-PROCESSING BUFFER

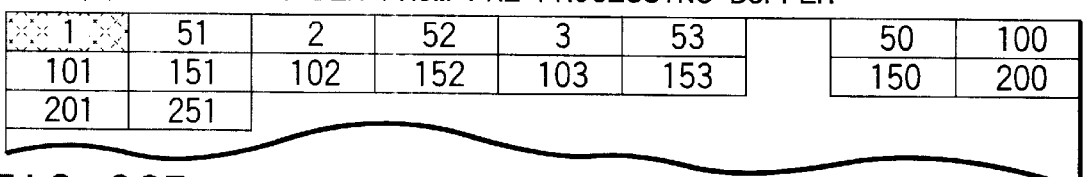

FIG. 22B (3) PRE-PROCESSING OUTPUT ORDER

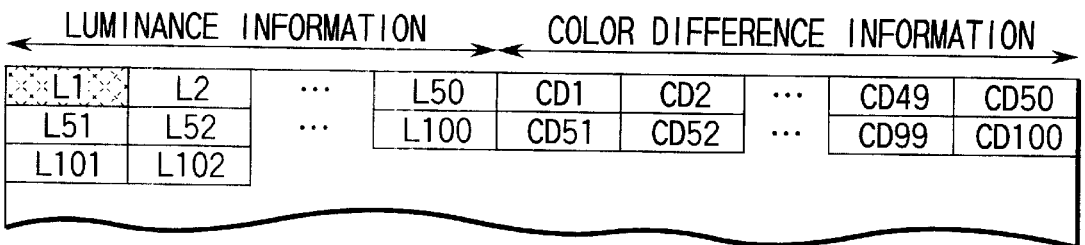

FIG. 22C    L:LUMINANCE    CD:COLOR DIFFERENCE

— 1 —

DATA COMPRESSION METHOD FOR EFFICIENTLY COMPRESSING DATA BASED ON DATA PERIODICITY

TECHNICAL FIELD

The present invention generally relates to a data compression method and, more particularly, to a data compression method of efficiently compressing particularly image data using a data compression technique based on a dictionary-based method that is represented by LZ77 and LZ78.

BACKGROUND ART

Current data compression methods of compressing data by a dictionary-based method are derived from Abraham Lempel and Jacob Ziv, "A Universal Algorithm for Sequential Data Compression", IEEE Transaction on Information Theory (1977).

This method is generally called a Lempel-Ziv encoding slide dictionary method or LZ77 method.

The LZ77 method is introduced in, e.g., Seiji Munakata, "Ziv-Lempel Data Compression Method", Information Processing, Vol. 26, No. 1 (1985).

The LZ77 algorithm is a method of segmenting data to be encoded into a stream having a maximum matching length from an arbitrary position of a past data stream, and encoding the segmented stream as a copy of the past stream.

More specifically, as shown in FIG. 3, the LZ77 algorithm uses a moving window storing encoded input data and a prefetch buffer storing data to be encoded, and collates all partial sequences of a data sequence in the moving window with those in the prefetch buffer to obtain a matching partial sequence having a maximum length in the moving window.

To designate a partial sequence having a maximum length in the moving window, a combination of "the start position of a partial sequence having a maximum length", "a matching length", and "a next symbol which cancels matching" are encoded.

An encoded data sequence in the prefetch buffer is moved to the moving window, and a new data sequence corresponding to the encoded data sequence is input to the prefetch buffer.

The same processing is repeated to decompose data into partial sequences and encode the partial sequences.

Many improvements of this basic data compression technique have been proposed.

For example, there is an LZSS encoding method of setting a flag for identifying whether data is an encoded code or raw data and when the encoded data is longer than the raw data, encoding the raw data (T. C. Bell, "Better OPM/L Text Compression", IEEE Transaction Commun., Vol. COM-34, No. 12, Dec. (1986)).

Another reference is M. Nelson, "Data Compression Handbook: Second Edition", Toppan (1996), ISBN4-8101-8605-9.

In resent years, OA systems (scanners, printers, digital copying machines, and the like) are becoming popular, and higher speeds and higher resolutions are required.

These systems must process large-amount image data at a high speed, so that they must reduce the processing data amount by compressing data at a high speed and high compression ratio.

The conventional data compression technique includes standard methods such as MMR and JBIG. However, MMR tends to decrease the compression ratio for a fine image.

— 2 —

JBIG, which attains almost the highest compression ratio, basically processes data in units of pixels, is limited in an increase in speed, and thus cannot be employed in high-speed systems.

The above dictionary-based compression method basically processes data in units of bytes, can attain a much higher speed than JBIG, can keep the compression ratio for a fine image in comparison with MMR, and is suitable for high-speed, high-resolution OA systems.

In encoding, however, a conventional LZ77-based data compression apparatus must compare a data sequence to be encoded with data sequences starting from all positions in the moving window in order to obtain a matching partial data sequence having a maximum length in the moving window.

More specifically, as shown in FIG. 3, a data sequence to be encoded is compared with a data sequence starting from the position of offset 1 in the moving window, a data sequence starting from the position of offset 2, . . . , and a data sequence starting from the position of offset n (n is the size of the moving window), thereby finding an offset having a maximum matching length.

Hardware which implements this at a high speed is disclosed in U.S. Pat. No. 5,003,307.

As shown in FIG. 4, this hardware implements a moving window having a moving window size of n by n shift registers SR1 to SRn, and parallel-processes n comparisons using n comparators CMP1 to CMPn.

This method can advantageously process one data by one clock, but requires comparators equal in number to the moving window size and becomes difficult to realize for a larger moving window size.

For example, for a moving window size of 2 kB, this conventional method requires 2 k comparators.

DISCLOSURE OF INVENTION

The present invention has been made in consideration of the above situation, and has as its object to provide an improvement of an apparatus and method for comparing dictionary data with input data to encode matching data and decoding encoded compressed data in a data processing apparatus and data processing method and, more particularly, to provide an LZ77-based data compression method with a small number of comparators based on image data periodicity.

It is another object of the present invention to provide a data compression method for performing pre-processing of rearranging data based on image data periodicity so as to allow data having high matching possibility to come close to each other.

To achieve the above objects, according to one aspect of the present invention, there is provided a data compression method for compressing an input data stream and outputting the encoded stream, comprising the steps of:

storing encoded input data in a moving window having a predetermined size, comparing a partial sequence starting from a given position (entry) in the moving window with a data sequence to be encoded by a plurality of comparators, finding an entry having a maximum matching length by a matching finder in comparison by the plurality of comparators, and encoding a pair of offsets up to the entry and a matching length (offsets and matching length) by a matching code generator when matching is found by the matching finder, wherein the number of comparators is smaller than the size of the moving window, and some of offsets near offset 0 (0 indicates including no offset), offsets near offset L, offsets near offset 2L, offsets near offsets 3L, . . . are used as entries.

To achieve the above objects, according to another aspect of the present invention, there is provided a data compression method for compressing an input data stream and outputting the encoded stream, comprising the steps of:

rearranging by a pre-processing unit a byte order of the input data stream:

0, 1, 2, 3, . . . , L, L+1, L+2, . . . , 2L, 2L+1, 2L+2, . . . into

0, L, 2L, . . . , nL, 1, l+1, 2L+1, . . . , nL+1, 2, L+2, 2L+2, . . . , nL+2, . . . (n=1, 2, . . . ), and compressing the input data stream rearranged by the pre-processing unit and outputting the encoded stream from a compression type compression apparatus main body.

To achieve the above objects, according to still another aspect of the present invention, there is provided a data compression method for compressing an input data stream and outputting the encoded stream, comprising the steps of:
rearranging by a pre-processing unit an order of m-bit bytes (m=p×q; p is an integer not less than 1 and q is an integer not less than 2) of the input data stream:

---

First Line: 0, 1, 2, . . . ,
Second Line: L, L+1, L+2, . . . ,
... ...
qth Line: (q−1)L, (q−1)L+1, (q−1)L+2, . . . , qL−1
into
    a new first byte made up of $\underline{m}$ bits:
    0 : b(0), . . . , 0 : b(p−1),
    L : b(0), . . . , L : b(p−1),
    ... ...
    (q−1)L : b(0), . . . , (q−1)L : b(p−1)
    a new second byte made up of $\underline{m}$ bits:
    0 : b(0), . . . , 0 : b(2p−1),
    L : b(0), . . . , L : b(2p−1),
    ... ...
    (q−1)L : b(0), . . . , (q−1)L : b(2p−1)
    ... 
    a new qth byte made up of $\underline{m}$ bits:
    0 : b((q−1)p), . . . , 0 : b(qp−1),
    L : b((q−1)p), . . . , L : b(q2p−1),
    ... ...
    (q−1)L : b((q−1)p), . . . , (q−1)L : b(q2p−1),
    a new (q+1)th byte made up of $\underline{m}$ bits:
    1 : b(0), . . . , 1 : b(p−1),
    L+1 : b(0), . . . , L+1 : b(p−1),
    ... ...
    (q−1)L+1 : b(0), . . . , (q−1)L+1 : b(p−1),
    ... 
    a new (q+2)th byte made up of $\underline{m}$ bits:
    1 : b(p), . . . , 1 : b(2p−1),
    L+1 : b(p), . . . , L+1 : b(2p−1),
    ... ...
    (q−1)L+1 : b(p), . . . , (q−1)L+1 : b(2p−1),
    ... ...
    a new 2qth byte made up of $\underline{m}$ bits:
    1 : b((q−1)p), . . . , 1 : b(qp−1),
    L+1 : b((q−1)p), . . . , L+1 : b(q2p−1),
    ... ...
    (q−1)L+1 : b((q−1)p), . . . , (q−1)L+1 : b(q2p−1),
    ... ...

---

(note that the first, second, . . . , mth bits in a byte are respectively represented by b(0), b(1), . . . , b(m−1), and left and right sides of "0:b(0)" respectively represent the byte order of an input stream and a bit in the byte), and compressing the input data stream rearranged by the pre-processing unit and outputting the encoded stream by a compression type compression apparatus main body.

To achieve the above objects, according to still another aspect of the present invention, there is provided a data compression method for compressing an input data stream and outputting the encoded stream, comprising the steps of:

rearranging by a pre-processing unit a byte order of an input data stream:

---

0, 1, 2, 3, . . . , L, . . . (L is a rearrangement cycle, L = p × q; $\underline{p}$ and $\underline{q}$ are integers not less than 2)
into
    0, p, 2p, . . . , (q−1)p
    1, p+1, 2p+1, . . . , (q−1)p+1
    2, p+2, 2p+2, . . . , (q−1)p+2
    ... ...
    p−1, p+1−1, 2p+p−1, . . . , (q−1)p+p−1, and

--- compressing the input data stream rearranged by the pre-processing unit and outputting the encoded stream by a compression apparatus main body.

To achieve the above objects, according to still another aspect of the present invention, there is provided a data compression method for compressing an input data stream and outputting the encoded stream, wherein comprising the steps of:

rearranging by a pre-processing unit a byte order of an input data stream:

0, 1, 2, 3, . . . , L, . . . into 0, 2, 4, . . . , L−2, 1, 3, 5, . . . L−1, . . . (L is an even number) or 0, 2, 4, . . . , L−1, 1, 3, 5, . . . , L−2, . . . (L is an odd number), and compressing the input data stream rearranged by the pre-processing unit and outputting the encoded stream by a compression type compression apparatus

BRIEF DESCRIPTION OF DRAWINGS

FIG. 3 is a view for explaining the principle of a conventional LZ77 compression apparatus.

FIG. 4 is a diagram for explaining the arrangement of the conventional LZ77 compression apparatus.

FIG. 5 is a table for explaining offsets to be compared by comparators CM1 to CMP16 in the present invention.

FIGS. 6A to 6D are views for explaining other selection examples of comparison positions in the first embodiment according to the present invention.

FIGS. 7A and 7B are views for explaining other selection examples of comparison positions in the first embodiment according to the present invention.

FIGS. 14A to 14C are views for explaining rearrangement method 1 in the third embodiment according to the present invention.

FIGS. 15A and 15B are views for explaining rearrangement method 2 in the third embodiment according to the present invention.

FIGS. 18A and 18B are views for explaining rearrangement method 1 in the fourth embodiment according to the present invention.

FIGS. 19A and 19B are views for explaining rearrangement method 2 in the fourth embodiment according to the present invention.

FIGS. 20A and 20B are views for explaining rearrangement method 3 in the fourth embodiment according to the present invention.

FIGS. 22A to 22C are views for explaining a rearrangement method in the fifth embodiment according to the present invention.

BEST MODE OF CARRYING OUT THE INVENTION

Figure 1:
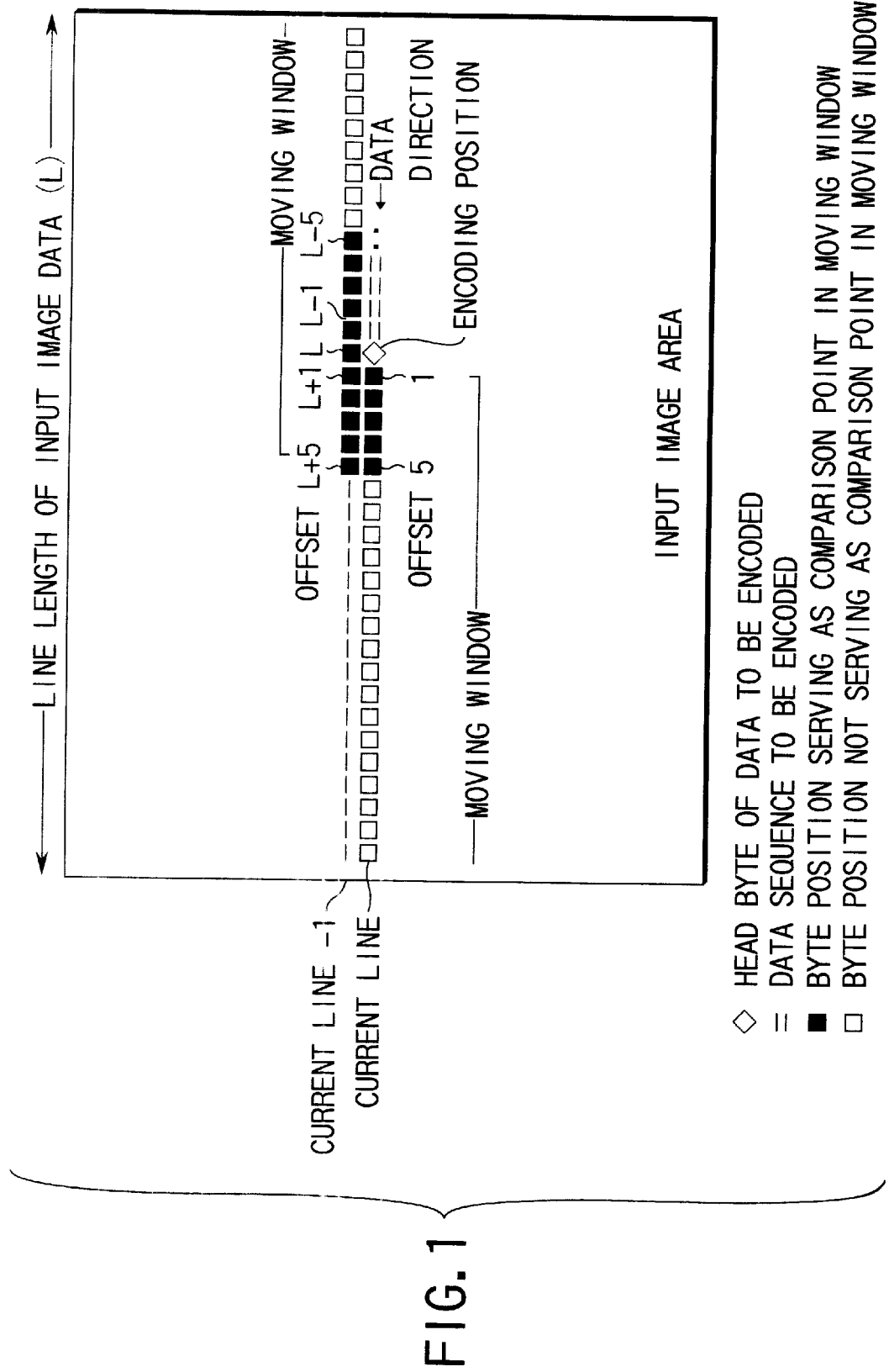
FIG. 1 is a view for explaining the principle of the first embodiment according to the present invention.

Embodiments of the present invention will be described below with reference to the several views of the accompanying drawing.

As described in Technical Field, U.S. Pat. No. 5,003,307 discloses an LZ77-based data compression apparatus implemented by hardware at a high speed.

In this reference, a moving window having a moving window size of n is implemented by n shift registers, and n comparisons are processed parallel by n comparators.

This method can advantageously process one data by one clock, but requires comparators equal in number to the moving window size and becomes difficult to realize for a larger moving window size.

The first embodiment of the present invention, therefore, easily realizes LZ77-based hardware by comparing a data sequence to be encoded with not data sequences starting from all positions in the moving window but data sequences starting from positions having high matching possibility.

For example, if the number of comparison positions is about 16 or 32, comparisons can be satisfactorily processed parallel by comparators equal in number to the comparison positions.

However, if the number of comparison positions is simply decreased, the matching possibility may decrease to decrease the compression ratio.

For this reason, the first embodiment selects comparison positions based on image data periodicity.

That is, a data sequence to be encoded is compared with not all partial sequences in the moving window but partial sequences starting from data positions having high matching possibility on the basis of the image data periodicity.

The principle of the first embodiment according to the present invention will be described with reference to FIG. 1.

In the first embodiment, the data unit is a byte.

Considering two-dimensional locality of image data, bytes most similar to a certain byte to be encoded are ones at upper, lower, right, and left positions around the target byte.

In general raster scan in an image data input order from an upper left position to a lower right position, right and lower bytes adjacent to a byte to be encoded have not been input yet and have not entered the moving window yet.

Thus, a byte to be encoded cannot be compared with right and lower adjacent bytes. A left byte adjacent to a byte to be encoded is the latest data input previously in the input order, and has entered the position of offset 1 in the moving window.

An upper adjacent byte has entered the position of offset L in the moving window for an input image data line length (width) of L bytes.

In this case, the moving window size must be L or more.

A conventional LZ-based CODEC ignores input periodicity even if the input is image data, and searches for a matching point to only the left for a byte to be encoded.

The first embodiment selects the upper adjacent position and its peripheral positions as comparison points for a byte to be encoded in addition to the left position.

Accordingly, the moving window includes bytes (bytes □ in FIG. 1) not serving as comparison points between bytes (bytes ■ in FIG. 1) serving as comparison points at two ends.

In data sequence portions (bytes ◇ and ==== ... in FIG. 1), a byte ◇ is a head byte.

Decreasing the number of comparison positions in this way can shorten the offset code.

For example, for a moving window size of 2 kB, 2 k codes are required as offsets in the prior art, but only 16 codes are required as offsets in the example of FIG. 1. When a simple code is selected, the offset code length is 11 bits in the prior art but is as short as 4 bits in the present invention.

Figure 2:
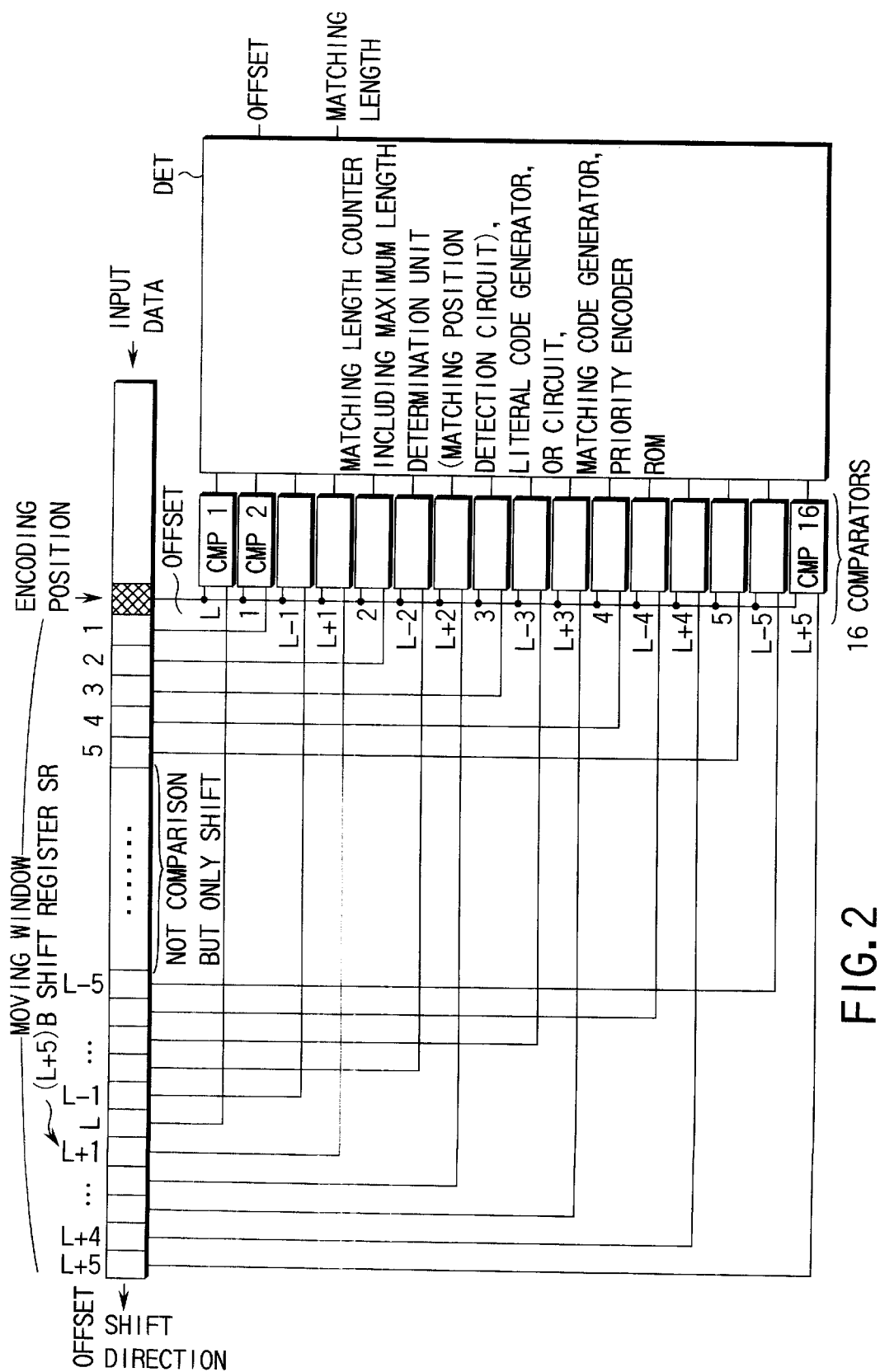
FIG. 2 is a diagram for explaining the arrangement of the first embodiment according to the present invention.
Figure 8A:
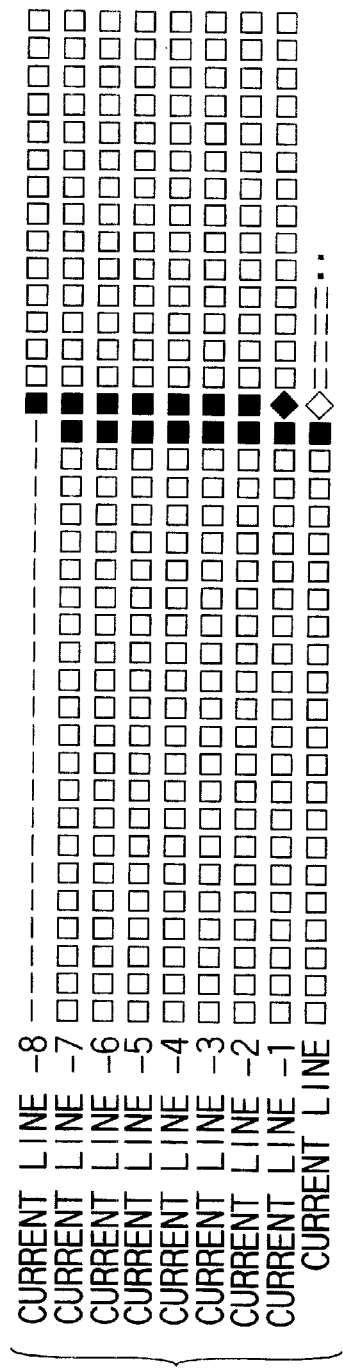
FIGS. 8A and 8B are views for explaining other selection examples of comparison positions in the first embodiment according to the present invention.
Figure 8B:
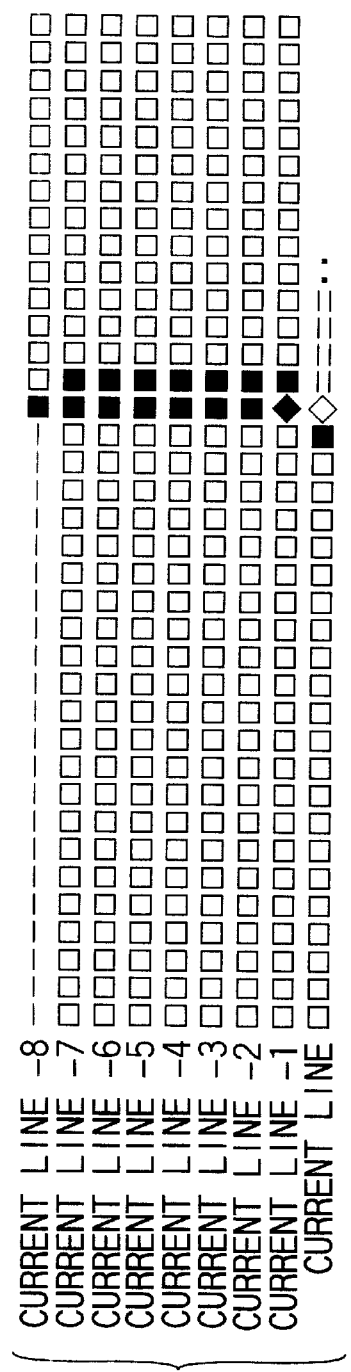
Figure 9A:
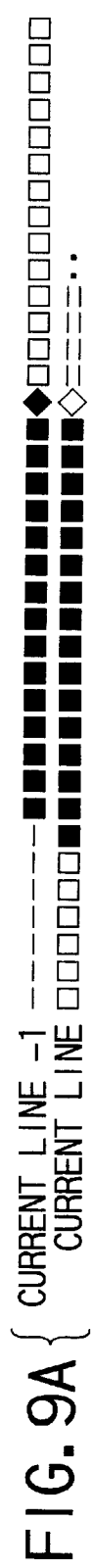
FIGS. 9A and 9B are views for explaining other selection examples of comparison positions in the first embodiment according to the present invention.
Figure 9B:
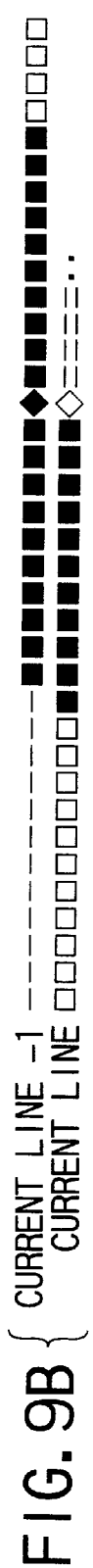

FIG. 2 is a block diagram showing the arrangement of the first embodiment according to the present invention.

The first embodiment comprises (L+5)B shift registers SR for implementing a moving window with a predetermined size when L represents the length of one line of image data to be compressed, 16 comparators CMP1 to CMP16, and a matching position detection circuit (maximum length determination unit) DET, in addition to a line memory and memory controller (neither is shown).

The first embodiment adopts comparison positions (offsets 1, 2, ..., 5, L−5, L−4, ..., L−1, L, L+1, ..., L+5) shown in FIG. 1.

The line memory suffices to be a line buffer having a size of L−6 for an input data line length of L bytes.

While storing a data sequence (current line data) to be encoded in this line buffer, a data sequence (previous line data) before one line is sent to an encoder according to the first embodiment via a pre-processing unit (not shown) as follows.

In parallel with this, the current line data itself is sent to the encoder according to the first embodiment via the pre-processing unit (not shown) as follows.

In the encoder according to the first embodiment, previous line data is input from the pre-processing unit to five shift registers SR, and outputs from the respective shift registers are used as comparison position data of offsets 1 to 5.

Line data ahead by offset L−6 is input from the pre-processing unit to 11 shift registers SR, and outputs from the respective shift registers are used as comparison position data of offsets L−5 to L+5.

Each of the total of 16 comparison position data is input to one terminal of a corresponding one of the 16 comparators CMP1 to CMP16 and compared with the head byte (byte ◊ in FIG. 1) of a data sequence to be encoded that is commonly input to the other terminal of each of the comparators CMP1 to CMP16.

FIG. 5 shows offsets compared by the comparators CMP1 to CMP16.

Operation of the comparators CMP1 to CMP16 and matching position detection circuit (maximum length determination unit) DET will be explained.

Each of the comparators CMP1 to CMP16 has a matching continuation/matching end flag. The comparator performs comparison every clock preset to the matching continuation mode, and if nonmatching is found, sets the flag to the matching end mode to wait for next presetting.

First, the flags of the comparators CMP1 to CMP16 are preset, and a matching length counter in the matching position detection circuit (maximum length determination unit) DET is also initialized to 0.

The comparators and matching position detection circuit (maximum length determination unit) DET operate as follows every clock.

If all the flags change to the matching end mode at a matching length count of 0 (this indicates that data at the encoding position (byte ◊ in FIG. 1) does not match data at any comparison position (byte ■ in FIG. 1)), data at the encoding position is sent to a literal code generator in the matching position detection circuit (maximum length determination unit) DET to instruct generation of a literal code.

While at least one comparator is in the matching continuation mode, the matching length counter is counted up every clock.

Whether at least one comparator is in the matching continuation mode is determined by an OR circuit in the matching position detection circuit (maximum length determination unit) DET.

If matching ends at a matching length count of 1 or more, the matching position detection circuit (maximum length determination unit) DET generates a matching code.

At this time, the matching length counter sends a comparator number in the matching continuation mode and a matching length to a matching code generator in the matching position detection circuit (maximum length determination unit) DET.

When a plurality of comparators simultaneously end the matching continuation mode, one closest to comparator 1 is adopted.

This can be realized by using a priority encoder in the matching position detection circuit (maximum length determination unit) DET.

When the matching position detection circuit (maximum length determination unit) DET instructs generation of a literal code or matching code, the encoder presets the flags of the comparators CMP1 to CMP16 and initializes the matching length counter to 0, thereby continuing processing from the first operation.

The literal code generator adds a literal code marker to a head byte to be encoded and outputs the resultant data.

The matching code generator receives a comparator number and matching length, outputs a matching code made up of an offset code and matching length code in accordance with an encoding table, and in addition outputs the length of the matching code (the length of the offset code+the length of the matching length code).

The offset code, offset code length, matching length code, and length of the matching length code are prepared in a ROM for the matching code generator in the matching position detection circuit (maximum length determination unit) DET.

In packet packing, a code and code length are input from the literal code generator or matching code generator and packed.

Note that the first embodiment can adopt various comparison positions as shown in FIGS. 6A to 6D, 7A, 7B, 8A, 8B, 9A, and 9B in addition to the comparison positions shown in FIG. 1 (offsets 1, 2, . . . , 5, L−5, L−4, . . . , L−1, L, L+1, . . . , L+5).

The second embodiment of the present invention will be described.

The second embodiment selects comparison points every other byte, and input image data is multivalued data which represents one pixel by two bytes.

Of the two bytes, the first byte represents luminance information, and the second byte represents color difference information.

Figure 10:
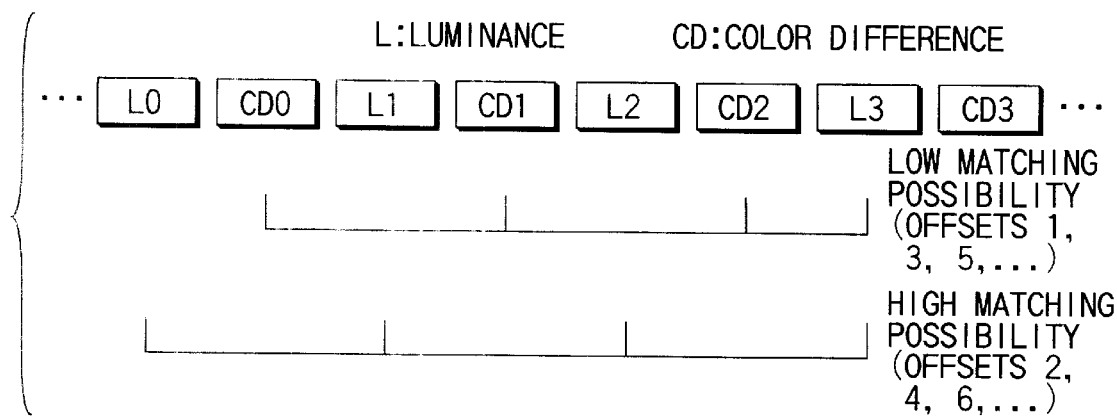
FIG. 10 is a view for explaining the principle of the second embodiment according to the present invention.

When a given byte is compared with another byte, as shown in FIG. 10, a luminance byte and color difference byte have low matching possibility, and luminance bytes or color difference bytes have high matching possibility.

In other words, it is not effective to select points apart by an odd number of points as comparison points.

In this case, therefore, comparison points are selected not every byte, unlike the first embodiment, but every other byte, thereby more effectively compressing data.

Figure 12A:
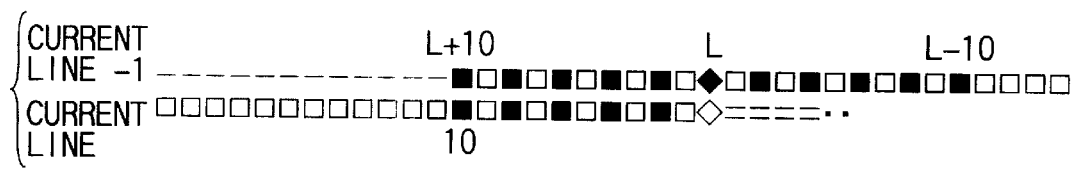
FIGS. 12A and 12B are views for explaining other selection examples of comparison positions in the second embodiment according to the present invention.
Figure 12B:
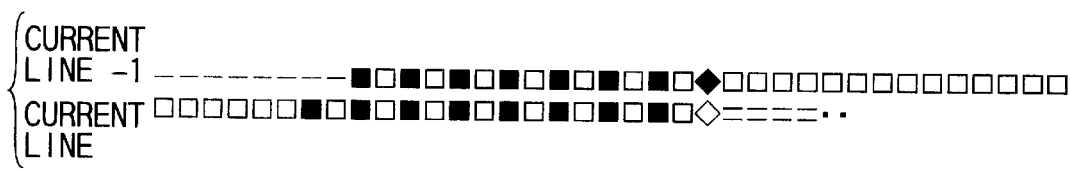

That is, comparison positions are selected as shown in FIGS. 12A and 12B.

Figure 11:
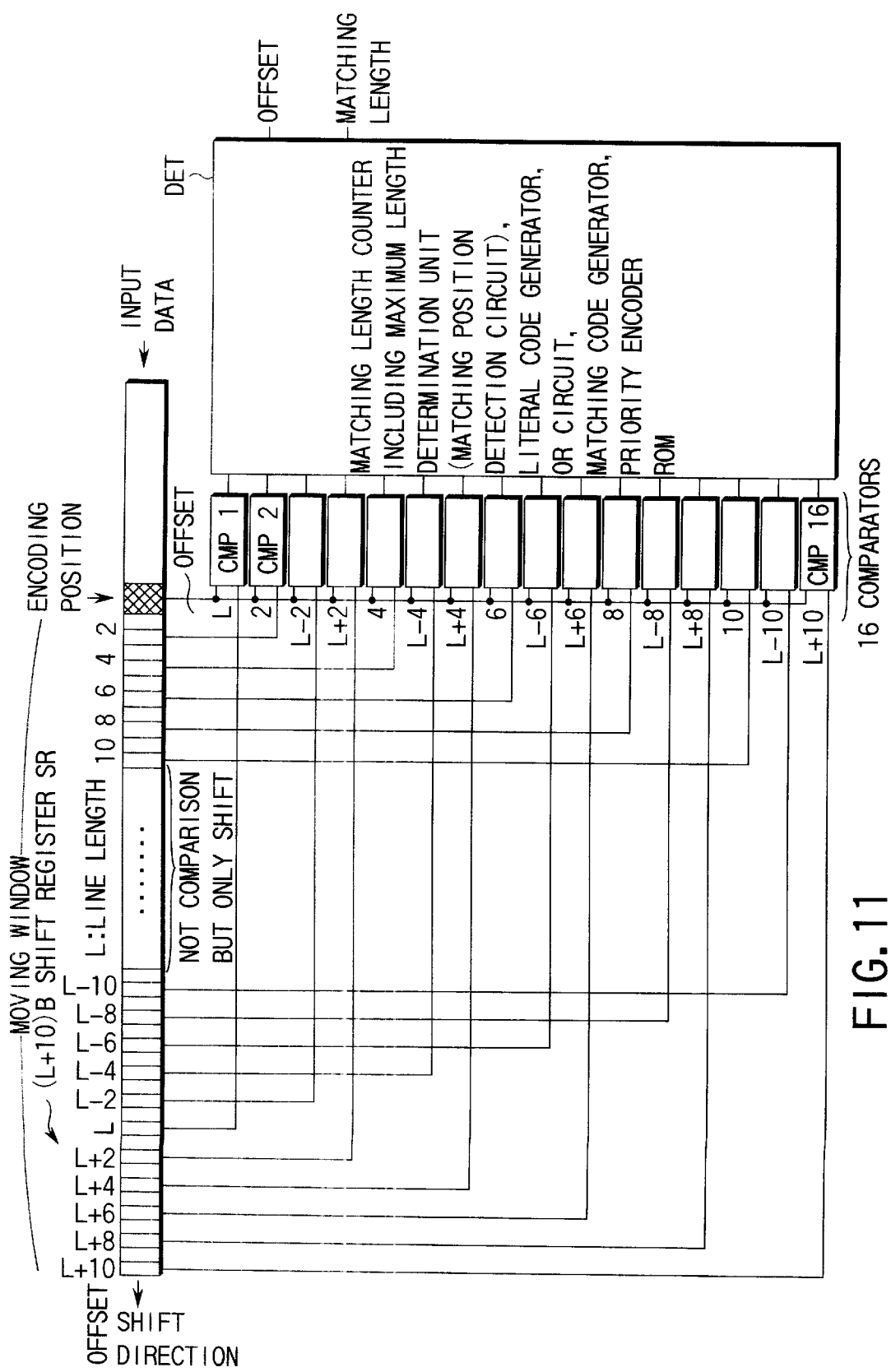
FIG. 11 is a diagram for explaining the arrangement of the second embodiment according to the present invention.

FIG. 11 is a block diagram showing the arrangement of the second embodiment according to the present invention.

The second embodiment comprises (L+10)B shift registers SR for implementing a moving window when L represents the length of one line of image data to be compressed, 16 comparators CMP1 to CMP16, and a matching position detection circuit (maximum length determination unit) DET, in addition to a line memory and memory controller (neither is shown).

The second embodiment adopts comparison positions (offsets 1, 2, . . . , 10, L−10, L−9, . . . , L−1, L, L+1, . . . , L+10) shown in FIG. 12A.

The line memory suffices to be a line buffer having a size of L−11 for an input data line length of L bytes.

While storing a data sequence (current line data) to be encoded in this line buffer, a data sequence (previous line data) before one line is sent to an encoder according to the second embodiment via a pre-processing unit (not shown) as follows.

In parallel with this, the current line data itself is sent to the encoder according to the second embodiment via the pre-processing unit (not shown) in as follows.

In the encoder according to the second embodiment, previous line data is input from the pre-processing unit to every other ones of 10 shift registers SR, and outputs from the respective shift registers are used as comparison position data of offsets 2, 4, 6, 8, and 10.

Line data ahead by offset L−11 is input from the pre-processing unit to every other ones of 21 shift registers SR, and outputs from the respective shift registers are used as comparison position data of offsets L−10, L−8, ..., L−2, L, L+2, ..., L+8, L+10.

Each of the total of 16 comparison position data is input to one terminal of a corresponding one of the 16 comparators CMP1 to CMP16 and compared with the head byte (byte ◊ in FIG. 12A) of a data sequence to be encoded that is commonly input to the other terminal of each of the comparators CMP1 to CMP16.

Note that offsets compared by the comparators CMP1 to CMP16 are shown in FIG. 5.

The remaining arrangement and operation of the second embodiment are the same as in the first embodiment.

The third embodiment of the present invention will be described.

Figure 13:
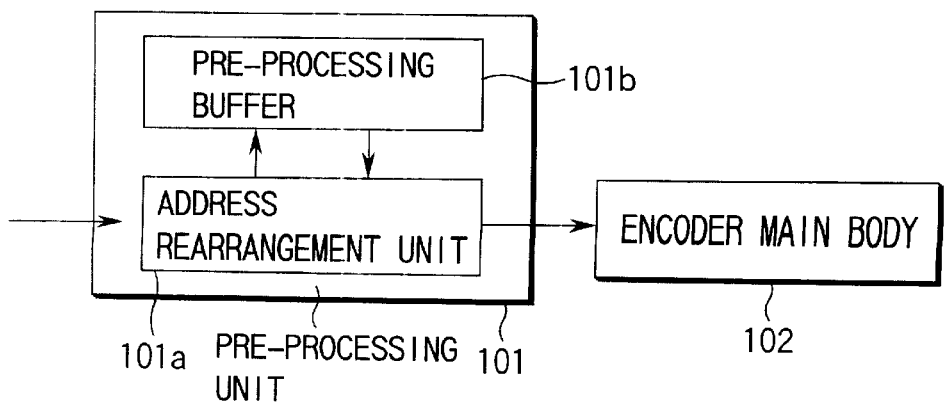
FIG. 13 is a block diagram for explaining the arrangement of the third embodiment according to the present invention.

FIG. 13 is a block diagram showing the arrangement of the third embodiment according to the present invention.

In the third embodiment, input image data is rearranged and then encoded by an encoder main body 102 by performing subscanning in a predetermined direction by a pre-processing unit 101 having an address rearrangement unit 101a and pre-processing buffer 101b so as to efficiently execute encoding by an encoder according to the third embodiment of the present invention or other encoders.

For example, if image data having 1-bit pixels is raster-input, one byte as an LZ processing unit is made up of 8 pixels (8 bits) successive in the main scanning direction (horizontal direction).

When a certain byte of the image data is compared with a left adjacent byte, each bit serving as each pixel is compared with a pixel apart by 8 pixels.

When a certain byte is compared with an upper adjacent byte (at the same position on the previous line), each pixel is compared with a pixel apart by one pixel.

In this way, the general method excessively gives priority to an upper adjacent byte.

Hence, rearrangement of input image data according to the third embodiment is done to make comparison pixel intervals in the horizontal and vertical directions equal, thereby obtaining a higher data compression ratio.

More specifically, rearrangement methods 1, 2, and 3 (to be described below) are done as a method of vertically subscanning a plurality of lines without rearranging bits in a byte.

In rearrangement method 1, two lines are vertically subscanned without rearranging bits in a byte, as shown in FIGS. 14A to 14C.

In rearrangement method 2, four lines are vertically subscanned without rearranging bits in a byte, as shown in FIGS. 15A and 15B.

Figures 16A, 16B, 17:
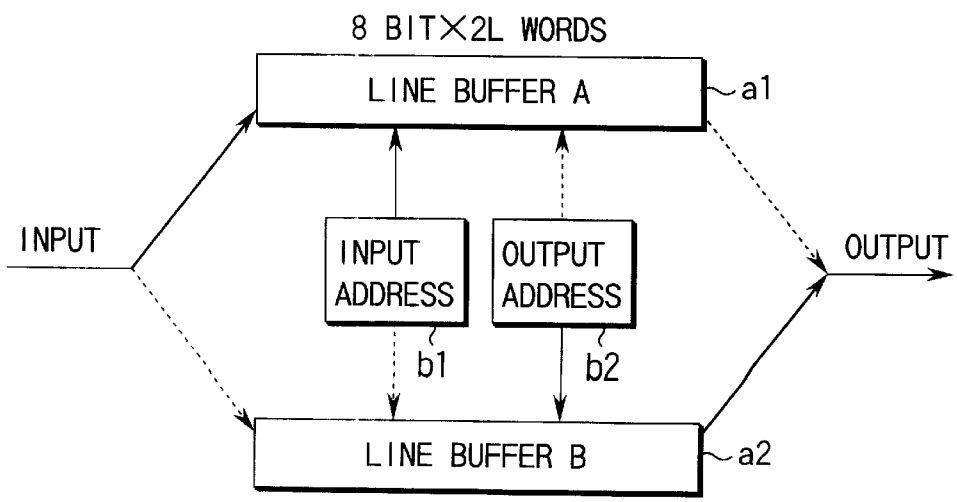
FIGS. 16A and 16B are views for explaining rearrangement method 3 in the third embodiment according to the present invention.
FIG. 17 is a block diagram for explaining operation of a pre-processing (line) buffer (controller) 101b in a pre-processing unit 101 in the third embodiment according to the present invention.

In rearrangement method 3, eight lines are vertically subscanned without rearranging bits in a byte, as shown in FIGS. 16A and 16B.

A layout example and operation of rearrangement method 1 will be explained.

FIGS. 14A to 14C show input orders when the length of one line is 100 bytes.

Input image data is input to the pre-processing unit 101 in a byte order (1, 2, 3, ..., 100 on the first line, 101, 102, ..., 200 on the second line, and 201, ... on the third line) by normal scanning (raster scanning).

These bytes are rearranged by reading out them by the buffer 101b in the pre-processing unit 101 in a byte order (1, 3, 5, ..., 199 on the first line, 2, 4, 6, ..., 200 on the second line, and 201, ... on the third line) as shown in FIG. 14B.

Outputs from the pre-processing unit 101 are rearranged in a byte order (1, 2, 3, ..., 200 on the first line, and 201, ... on the second line) as shown in FIG. 14C.

Operation of the pre-processing (line) buffer (controller) 101b in the pre-processing unit 101 will be explained with reference to FIG. 17.

The line buffer controller 101b comprises two banks of 2-line buffers b1 and b2, an input address generator b3, and an output address generator b4.

Addresses to the line buffers b1 and b2 are controlled as follows.

When input addresses are 1, 2, 3, ..., 100, 101, 102, ..., 200 (a 100-byte line), output addresses are 1, 101, 2, 102, ..., 100, 200.

The banks are switched as follows.
(1) Bank 1 receives the bytes of lines 1 and 2, and bank 2 is at rest.
(2) Bank 1 reads out the bytes of lines 1 and 2 in the memory, and rearranges and sends them to the encoder. Bank 2 receives the bytes of lines 3 and 4.
(3) Bank 1 receives the bytes of lines 5 and 6. Bank 2 reads out the bytes of lines 3 and 4, and rearranges and sends them to the encoder.
(4) The same processing is repeated.

As for rearrangement methods 2 and 3 as shown in FIGS. 15A, 15B, 16A, and 16B, only the readout order from the pre-processing buffer 101b and the pre-processing output order are illustrated because the pre-processing input order is common to the respective methods.

The fourth embodiment of the present invention will be described.

The fourth embodiment of the present invention sends data to an encoder after performing different rearrangement from the third embodiment with the same arrangement as the third embodiment shown in FIG. 13.

More specifically, the fourth embodiment of the present invention adopts rearrangement method 1 of rearranging bits into a rectangular block of 4×2 bits (the numbers of bits in the horizontal and vertical directions), as shown in FIGS. 18A and 18B, rearrangement method 2 of rearranging bits into a 2×4-bit rectangular block, as shown in FIGS. 19A and 19B, and rearrangement method 3 of rearranging bits into a 1×8-bit rectangular block, as shown in FIGS. 20A and 20B.

As for rearrangement methods 1, 2, and 3 as shown in FIGS. 18A, 18B, 19A, 19B, 20A, and 20B, only the readout order from a pre-processing buffer 101b and the pre-processing output order are illustrated because the pre-processing input order is common to the respective methods of the third embodiment.

Figure 21:
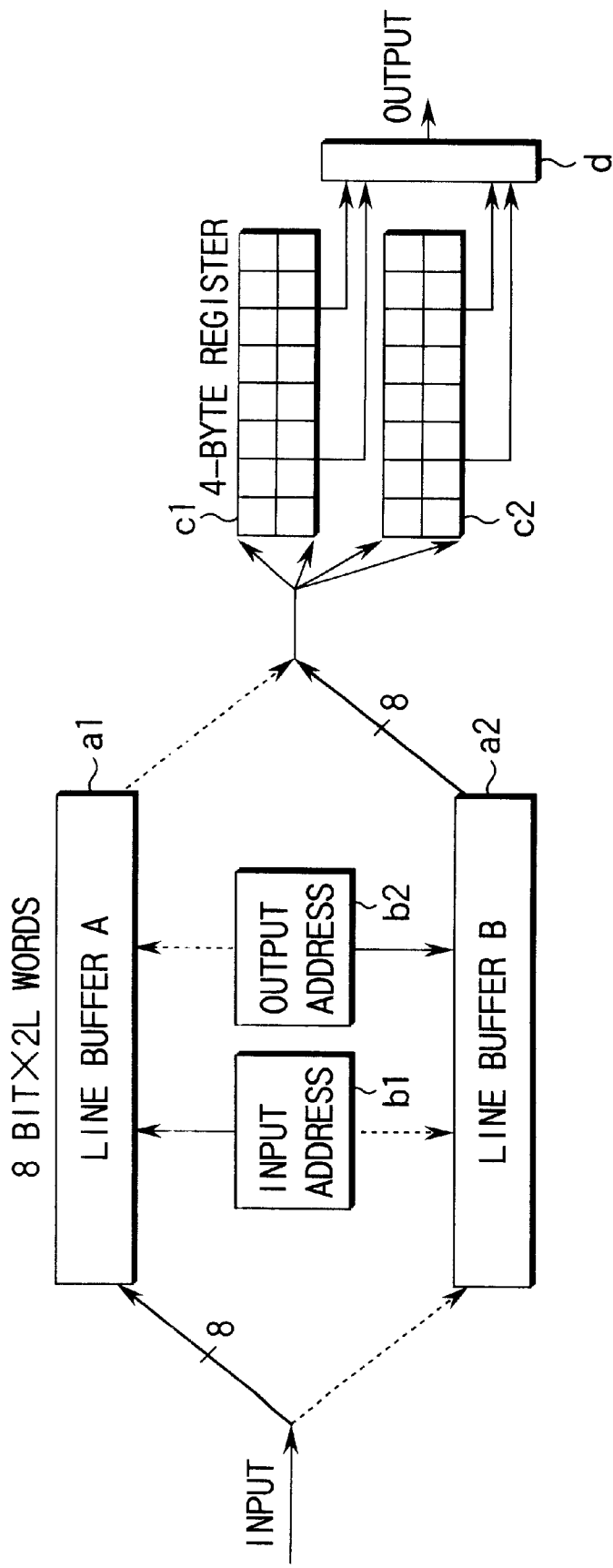
FIG. 21 is a block diagram for explaining operation of a pre-processing (line) buffer (controller) 101b in a pre-processing unit 101 in the fourth embodiment according to the present invention.

Operation of the pre-processing (line) buffer (controller) 101b in a pre-processing unit 101 will be explained with reference to FIG. 21.

In the fourth embodiment, the line buffer controller 101b shown in FIG. 13 comprises two banks of 8-bit×2-line buffers b1 and b2, an input address generator b3, an output address generator b4, 4-byte×2-line shift registers c1 and c2, and a serial-to-parallel converter d1.

Addresses to the line buffers b1 and b2 are controlled as follows.

When input addresses are 1, 2, 3, . . . , 100, 101, 102, . . . , 200 (a 100-byte line), output addresses are 1, 101, 2, 102, . . . , 199, 200.

The fifth embodiment of the present invention will be described below.

The fifth embodiment of the present invention performs different rearrangement from the third embodiment with the same arrangement as the third embodiment shown in FIG. 13, and then sends the results to an encoder.

More specifically, the fifth embodiment of the present invention arranges luminance bytes and color difference bytes, respectively, in the first and second halves of a line within the line, as shown in FIGS. 22A to 22C.

As shown in FIG. 22A, image data is input to a pre-processing unit 101 by normal scanning (raster scanning).

FIGS. 22A to 22C show input orders when the length of one line is 100 bytes.

The image data is rearranged by reading out it by a buffer 101b in the pre-processing unit 101, as shown in FIG. 22B.

Outputs from the pre-processing unit 101 are arranged as shown in FIG. 22C.

Figure 23:
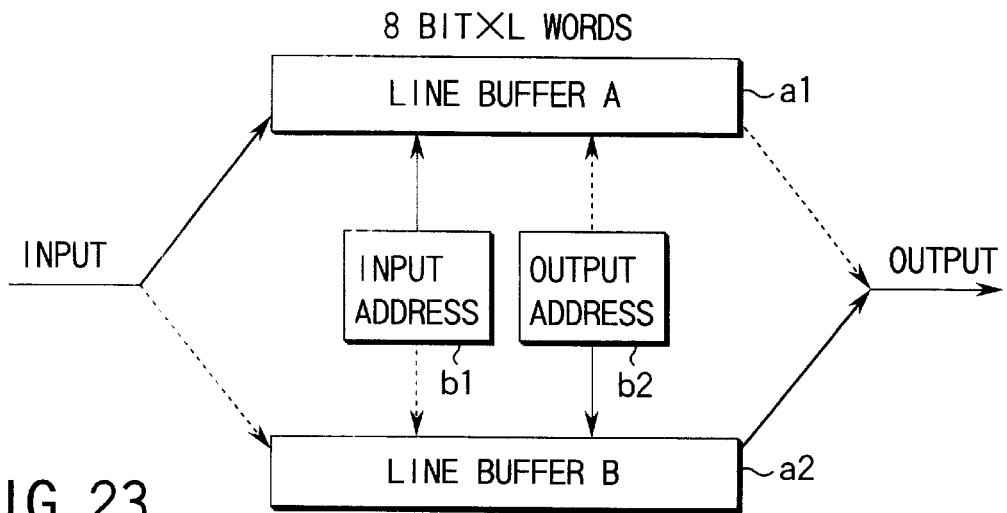
FIG. 23 is a block diagram for explaining operation of a pre-processing (line) buffer (controller) 101b in a pre-processing unit 101 in the fifth embodiment according to the present invention.

Operation of the pre-processing (line) buffer (controller) 101b in the pre-processing unit 101 will be explained with reference to FIG. 23.

In the fifth embodiment, the line buffer controller 101b shown in FIG. 13 comprises two banks of 8-bit×2-line buffers b1 and b2, an input address generator b3, and an output address generator b4.

Addresses to the line buffers b1 and b2 are controlled as follows.

When input addresses are 1, 2, 3, . . . , 100 (a 100-byte line), output addresses are 1, 51, 2, 52, . . . , 50, 100.

The respective embodiments in the present invention will be summarized.

(First Embodiment)

The encoder main body according to the first embodiment comprises n line buffers, uses peripheral positions on a current line, previous line, second previous line, . . . as entries, and preferentially assigns short offset codes to identical positions on a previous line, second previous line, More specifically, a conventional LZ77-based data compression apparatus requires many comparators in order to obtain a matching partial sequence having a maximum length in a moving window. To the contrary, the first embodiment is based on image data periodicity. Data to be encoded has high matching possibility with data at an identical position or peripheral positions on a previous line, an identical position or peripheral positions on the second previous line, an identical position or peripheral positions on the third previous line, .Thus, some of positions (0 represents including no offset) near offset 0 having high matching possibility, positions near offset L (L is an image line length and is externally supplied to the compression apparatus), positions near offset 2L, positions near offset 3L, . . . are used as entries instead of comparison with all entries in the moving window. As a result, a high data compression ratio can be obtained with a small number of comparators.

(Second Embodiment)

The encoder main body according to the second embodiment is different from the encoder main body according to the first embodiment in that entries are set every n bytes for n-byte blocks. Particularly for a dot image, entries are set to positions apart by a dot interval×n (n=1, 2, . . . ) If a block length÷bytes has a remainder, entries are set every least common multiple.

If the dot interval is not an integer multiple of bytes, entries are set to positions apart by a least common multiple×n.

In the first embodiment, when image data is an image of 2-byte pixels, data to be encoded has high matching possibility with entries at offsets 2, 4, . . . , and low matching possibility with entries at offsets 1, 3, As for a previous line and second previous line, data to be encoded similarly has high matching possibility with entries at offsets L±2, L±4, . . . , and low matching possibility with entries at offsets L±1, L±3, . . . .

Hence, the second embodiment can attain a high data compression ratio with a small number of comparators by using, as entries, offsets M, 2M, . . . (M is the byte length of one pixel) near offset 0, offsets L±M, L±2M, . . . near offset L, and offsets 2L±M, 2L±2M, . . . near offset 2L. When the interval between dots in the main scanning direction or the interval between peaks of a centralized dither is, e.g., 2 bytes in image data of a dot image or centralized dither image in addition to image data of 2-byte pixels, data to be encoded has high matching possibility with entries apart by the interval between dots in the main scanning direction or the interval between peaks of a centralized dither. Also in this case, a high data compression ratio can be attained with a small number of comparators by using, as entries, offsets M, 2M, . . . (M is the byte length of the interval between dots in the main scanning direction or the interval between peaks of a centralized dither) near offset 0, offsets L±M, L±2M, . . . near offset L, and offsets 2L±M, 2L±2M, . . . near offset 2L.

The byte length of one pixel, or the byte length of the interval between dots in the main scanning direction or the interval between peaks of a centralized dither may not be an integer multiple of one byte. In this case, letting m be the bit length of one pixel, or the bit length of the interval between dots in the main scanning direction or the interval between peaks of a centralized dither, and M be the least common multiple of m and 8, data to be encoded has high matching possibility with entries apart by M, 2M, . . . .

For this reason, a high data compression ratio can be attained with a small number of comparators by using, as entries, offsets M, 2M, . . . (M is the least common multiple of m and 8) near offset 0, offsets L±M, L±2M, . . . near offset L, and offsets 2L±M, 2L±2M, near offset 2L.

(Third Embodiment)

The third embodiment adopts pre-processing of rearranging by n line buffers the byte order of an input data stream:

0, 1, 2, 3, . . . , L, L+1, L+2, . . . , 2L, 2L+1, 2L+2, . . .

into

0, L, 2L, . . . , nL, 1, L+1, 2L+1, . . . , nL+1, 2, L+2, 2L+2, . . . , nL+2, . . . (n=1, 2, . . . )

The line buffers can be eliminated by performing the same operation in simple pre-processing in addition to address generation.

More specifically, the LZ-based compression apparatus can increase the compression ratio by rearranging input data and concentrating data having high matching possibility.

In the third embodiment, if input data is image data, given data is considered to match data adjacent in the subscanning direction at higher possibility than data adjacent in the main scanning direction. Thus, the data compression ratio can be increased by rearranging the byte order of an input data stream in the above manner by a pre-processing unit and inputting the data to the compression apparatus main body.

(Fourth Embodiment)

The fourth embodiment rearranges image data into n×(8÷n) rectangular blocks (4 bits in the main scanning direction×4 bits in the subscanning direction, 2×4, 1×8, and the like) by n line buffers.

The line buffers can be eliminated by performing the same operation in simple pre-processing in addition to address generation.

Similarly to the third embodiment, the fourth embodiment can increase the compression ratio by rearranging image data into successive two-dimensional rectangular blocks and inputting them into the compression apparatus main body.

Note that a pre-processing unit 101 according to the fourth embodiment includes the followings.

Figure 24A:
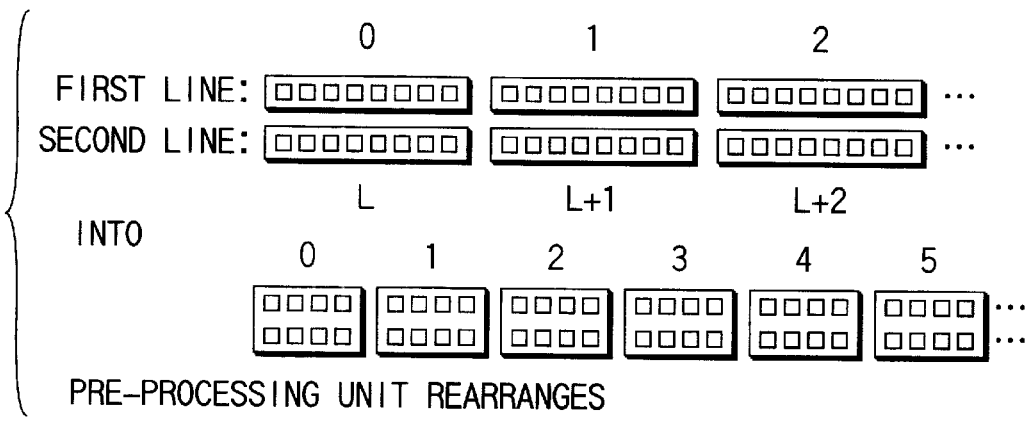
FIGS. 24A and 24B are views for explaining pre-processing of the pre-processing unit in the fourth embodiment according to the present invention.

(1) As shown in FIG. 24A, a pre-processing unit rearranges the order of m-bit bytes of an input data stream:

First Line: 0, 1, 2, . . . ,

Second Line: L, L+1, L+2, . . . , into 0, 1, 2, 3, 4, 5, . . .

in a 2(m/2)-byte order.

Figure 24B:
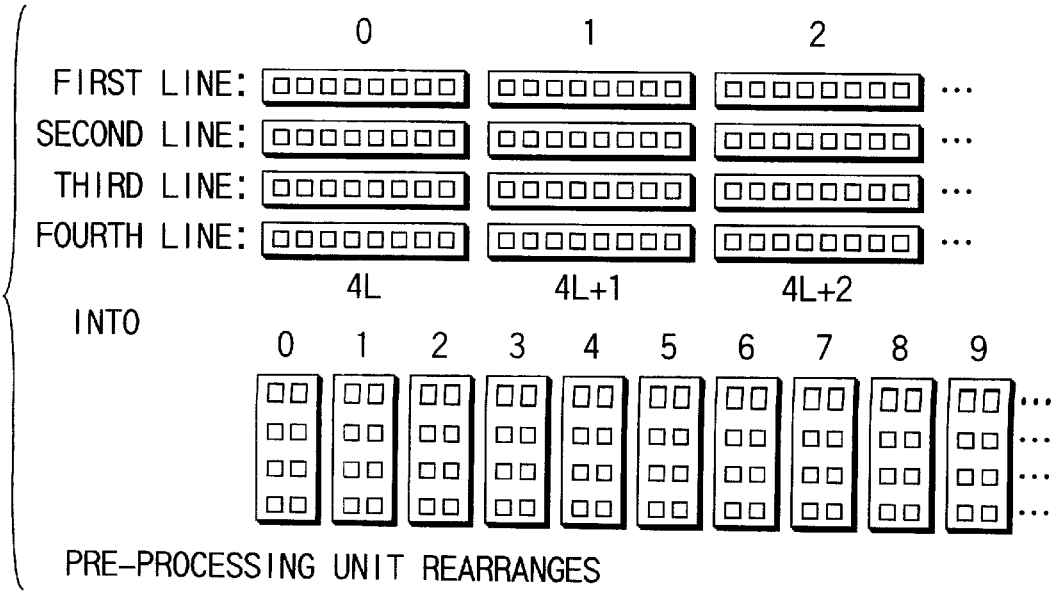

(2) As shown in FIG. 24B, a pre-processing unit rearranges the order of m-bit bytes of an input data stream:

First Line: 0, 1, 2, . . . ,

Second Line: 2L, 2L+1, 2L+2, . . . ,

Third Line: 3L, 3L+1, 3L+2, . . . ,

Fourth Line: 4L, 4L+1, 4L+2, . . . , into 0, 1, 2, 3, 4, 5, 6, 7, 8, 9, . . .

in a 4(m/4)-byte order.

Figure 25:
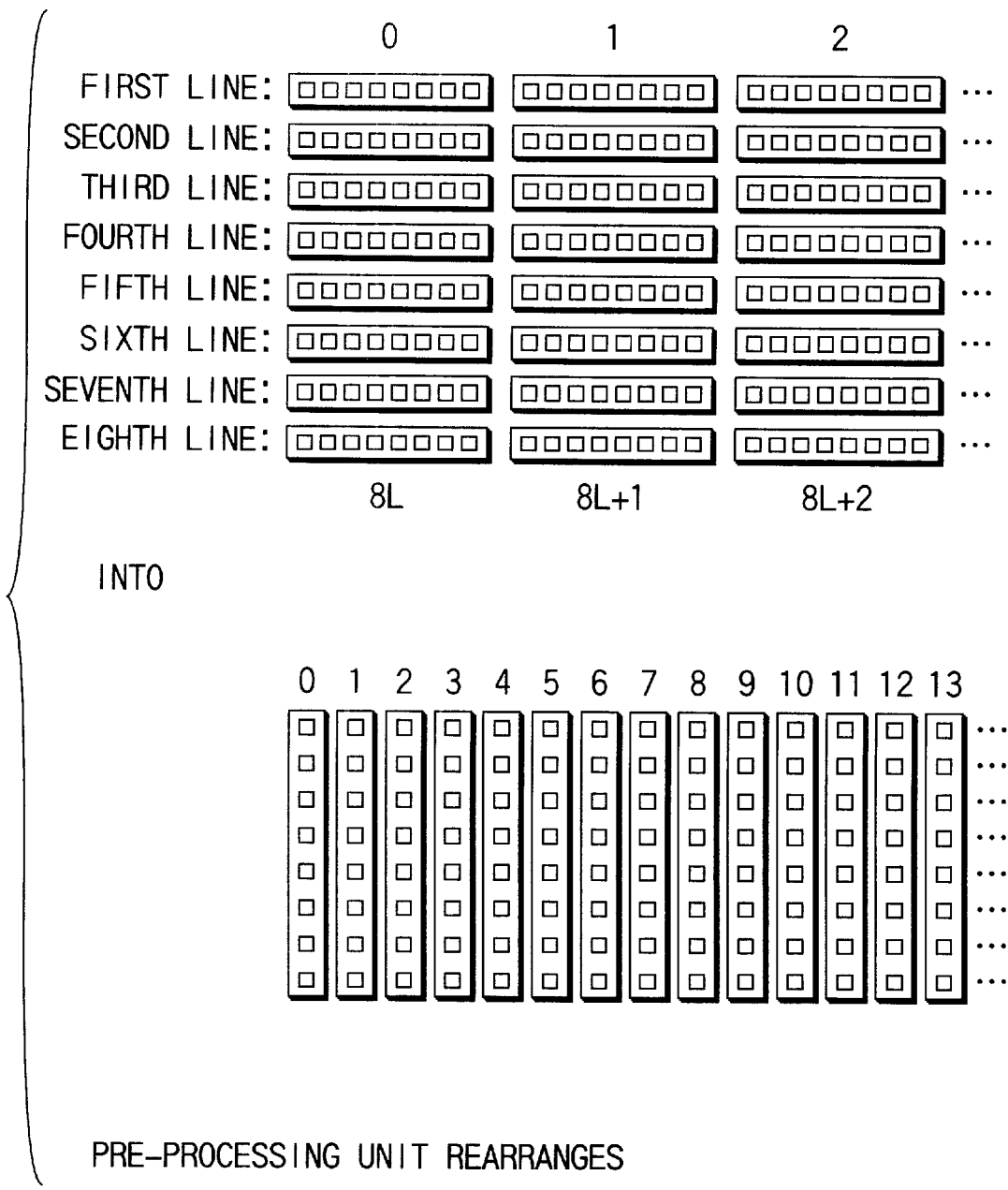
FIG. 25 is a view for explaining pre-processing of the pre-processing unit in the fourth embodiment according to the present invention.

(3) As shown in FIG. 25, a pre-processing unit rearranges the order of m-bit bytes of an input data stream:

First Line: 0, 1, 2, . . . ,

Second Line: 2L, 2L+1, 2L+2, . . . ,

Third Line: 3L, 3L+1, 3L+2, . . . ,

Fourth Line: 4L, 4L+1, 4L+2, . . . ,

Fifth Line: 5L, 5L+1, 5L+2, . . . ,

Sixth Line: 6L, 6L+1, 6L+2, . . . ,

Seventh Line: 7L, 7L+1, 7L+2, . . . ,

Eighth Line: 8L, 8L+1, 8L+2, . . . , into 0, 1, 2, 3, 4, 5, 6, 7, 8, 9, 10, 11, 12, 13, . . .

in an 8(m/8)-byte order.

Further, a pre-processing unit having a generalized one of the above arrangement rearranges the order of m-bit bytes (m=p×q; p is an integer of 1 or more and q is an integer of 2 or more) of an input data stream:

```
First Line: 0, 1, 2, . . . ,
Second Line: L, L+1, L+2, . . . ,
  . . .        . . .
qth Line: (q-1)L, (q-1)L+1, (q-1)L+2, . . . , qL-1
into
a new first byte made up of m bits:
0 : b(0), . . . , 0 : b(p-1),
L : b(0), . . . , L : b(p-1),
  . . .          . . .
(q-1)L : b(0), . . . , (q-1)L : b(p-1)
a new second byte made up of m bits:
0 : b(0), . . . , 0 : b(2p-1),
L : b(0), . . . , L : b(2p-1),
  . . .          . . .
(q-1)L : b(0), . . . , (q-1)L : b(2p-1)
  . . .          . . .
a new qth byte made up of m bits:
0 : b((q-1)p), . . . , 0 : b(qp-1),
```

-continued

```
L : b((q-1)p), . . . , L : b(q2p-1),
  . . .          . . .
(q-1)L : b((q-1)p), . . . , (q-1)L : b(q2p-1),
a new (q+1)th byte made up of m bits:
1 : b(0), . . . , 1 : b(p-1),
L+1 : b(0), . . . , L+1 : b(p-1),
  . . .          . . .
(q-1)L+1 : b(0), . . . , (q-1)L+1 : b(p-1),
  . . .          . . .
a new (q+2)th byte made up of m bits:
1 : b(p), . . . , 1 : b(2p-1),
L+1 : b(p), . . . , L+1 : b(2p-1),
  . . .          . . .
(q-1)L+1 : b(p), . . . , (q-1)L+1 : b(2p-1),
  . . .          . . .
a new 2qth byte made up of m bits:
1 : b((q-1)p), . . . , 1 : b(qp-1),
L+1 : b((q-1)p), . . . , L+1 : b(q2p-1),
  . . .          . . .
(q-1)L+1 : b((q-1)p), . . . , (q-1)L+1 : b(q2p-1),
  . . .          . . .
```

(note that the first, second, . . . , mth bits within a byte are respectively represented by b(0), b(1), . . . , b(m-1), and the left and right sides of "0:b(0)" respectively represent the byte order of an input stream and a bit in the byte).

As described above, this pre-processing includes 8-bit bytes for p=4 and q=2, 8-bit bytes for p=2 and q=4, 8-bit bytes for p=1 and q=8, In addition, a pre-processing unit rearranges the byte order of an input data stream:

```
0, 1, 2, 3, . . . , L, . . . (L is a rearrangement
  cycle, L = p × q; p and q are integers of 2 or more)
into
  0, p, 2p, . . . , (q-1)p
  1, p+1, 2p+1, . . . , (q-1)p+1
  2, p+2, 2p+2, . . . , (q-1)p+2
    . . .           . . .
  p-1, p+1-1, 2p+p-1, . . . , (q-1)p+p-1
```

(Fifth Embodiment)

For n-byte blocks, a pre-processing unit rearranges the luminance, color difference, luminance, color difference, luminance, color difference, . . . into the luminance, luminance, luminance, . . . , color difference, color difference, color difference, . . . within a line.

The line buffers can be eliminated by performing the same operation in simple pre-processing in addition to address generation.

More specifically, the fifth embodiment can increase the data compression ratio by rearranging image data of pixels each made up of a plurality of bytes into a sequence of the first bytes of respective pixels, a sequence of the second bytes of respective pixels, . . . , and allowing data having high matching possibility to come close to each other.

As has been described in detail, the present invention relates to an improvement of an apparatus and method for comparing dictionary data with input data to encode matching data, and decoding encoded compressed data in a data processing apparatus and data processing method and, more particularly, to provide an LZ77-based data compression method with a small number of comparators based on image data periodicity.

Moreover, the present invention can provide a data compression method of performing pre-processing of rearranging data based on image data periodicity so as to bring data having high matching possibility to come close to each other.

What is claimed is:

1. A data compression method for compressing an input data stream and outputting the encoded stream, comprising the steps of:
   storing encoded input data in a moving window having a predetermined size;
   comparing a partial sequence starting from a given position (entry) in the moving window with a data sequence to be encoded by a plurality of comparators;
   finding an entry having a maximum matching length by a matching finder in comparison by the plurality of comparators; and
   encoding a pair of offsets up to the entry and a matching length (offsets and matching length) by a matching code generator when matching is found by the matching finder,
   wherein the number of comparators is smaller than the size of the moving window, and some of offsets near offset 0 (0 indicates including no offset), offsets near offset L, offsets near offset 2L, offsets near offsets 3L, . . . are used as entries.

2. A data compression method according to claim 1, characterized in that L which defines an offset is an externally supplied parameter.

3. A data compression method according to claim 1, wherein when the input data is image data, L which defines an offset is a line length of the input image data.

4. A data compression method according to claim 1, wherein L which defines an offset is an externally supplied parameter, and offsets M, 2M, . . . (M is an externally supplied parameter; M<L), offsets L±M, L±2M, . . . , and offsets 2L±M, 2L±2M, . . . are respectively employed as offsets near offset 0, offsets near offset L, and offsets near offset 2L.

5. A data compression method according to claim 1, wherein when the input data is image data of pixels each having n bytes (n: an integer not less than 2), L which defines an offset is an externally supplied parameter, and offsets M, 2M, . . . (M=n; M<L), offsets L+M, L±2M, . . . , and offsets 2L±M, 2L±2M, are respectively employed as offsets near offset 0, offsets near offset L, and offsets near offset 2L.

6. A data compression method according to claim 1, wherein when the input data is a dot image or centralized dither image having an interval of n bytes between dots in a main scanning direction or between peaks in a centralized dither, L which defines an offset is a line length of the input image data, and offsets M, 2M, . . . (M=n; M<L), offsets L±M, L±2M, . . . , and offsets 2L±M, 2L±2M, . . . are respectively employed as offsets near offset 0, offsets near offset L, and offsets near offset 2L.

7. A data compression method according to claim 1, wherein when the input data is image data of pixels each having m bits (m is a natural number which cannot be divided by 8), L which defines an offset is an externally supplied parameter, and offsets M, 2M, . . . (M=a least common multiple of m and 8; M<L), offsets L±M, L±2M, . . . , and offsets 2L±M, 2L±2M, . . . are respectively employed as offsets near offset 0, offsets near offset L, and offsets near offset 2L.

8. A data compression method according to claim 1, wherein when the input data is a dot image or centralized dither image having an interval of m bits (m is a natural number which cannot be divided by 8) between dots in a main scanning direction or between peaks in a centralized dither, L which defines an offset is a line length of the input image data, and offsets M, 2M, . . . (M=a least common multiple of m and 8; M<L), offsets L±M, L±2M, . . . , and offsets 2L±M, 2L±2M, . . . are respectively employed as offsets near offset 0, offsets near offset L, and offsets near offset 2L.

9. A data compression method for compressing an input data stream and outputting the encoded stream, wherein comprising the steps of:
   rearranging by a pre-processing unit a byte order of the input data stream: 0, 1, 2, 3, . . . , L, L+1, L+2, . . . , 2L, 2L+1, 2L+2, . . . into 0, L, 2L, . . . , nL, 1, L+1, 2L+1, . . . , nL+1, 2, L+2, 2L+2, . . . , nL+2, . . . (n=1, 2, . . . ); and
   compressing the input data stream rearranged by the pre-processing unit, by a compression apparatus main body and outputting the encoded stream,
   wherein the step of outputting the encoded stream by the compression apparatus main body comprises the steps of:
   storing encoded input data to a moving window having a predetermined size;
   comparing a partial sequence starting from a given position (entry) in the moving window with a data sequence to be encoded by a plurality of comparators;
   finding an entry having a maximum matching length by a matching finder in comparison by the plurality of comparators; and
   encoding a pair of offsets up to the entry and a matching length (offsets and matching length) by a matching code generator when matching is found by the matching finder,
   wherein the number of comparators is smaller than the size of the moving window, and some of offsets near offset 0 (0 indicates including no offset), offsets near offset L (L is an externally supplied parameter), offsets near offset 2L, offsets near offsets 3L, . . . are used as entries.

10. A data compression method according to claim 9, wherein when the input data is image data, L which defines an offset is a line length of the input image data.

11. A data compression method according to claim 9, wherein when the input data is image data, L which defines an offset is a line length of the input image data, and
   when a transfer source of the input data is a memory, a readout order (order to supply addresses) is set to
   a head of a 0th line, a head of a first line, . . . , a head of an nth line, the next of the 0th line, the next of the first line, . . . , the next of the nth line,
   and processing is done by a pre-processing unit corresponding to a readout unit.

12. A data compression method for compressing an input data stream and outputting the encoded stream, wherein comprising the steps of:
   rearranging by a pre-processing unit a byte order of the input data stream: 0, 1, 2, 3, . . . L, L+1, L+2, . . . 2L, 2L+1, 2L+2, . . . into
   0, L, 2L, . . . nL, 1, L+1, 2L+1, . . . , nL+1, 2, L+2, 2L+2, . . . , nL+2, . . . (n=1, 2, . . . ); and
   compressing the input data stream rearranged by the pre-processing unit, by a compression apparatus main body and outputting the encoded stream,
   wherein the step of outputting the encoded stream by the compression apparatus main body comprises the steps of:

storing encoded input data to a moving window having a predetermined size;

comparing a partial sequence starting from a given position (entry) in the moving window with a data sequence to be encoded by a plurality of comparators;

finding an entry having a maximum matching length by a matching finder in comparison by the plurality of comparators; and encoding a pair of offsets up to the entry and a matching length (offsets and matching length) by a matching code generator when matching is found by the matching finder, wherein the number of comparators is smaller than the size of the moving window, and some of offsets near offset 0 (0 indicates including no offset), offsets near offset nL, offsets near offset 2nL, offsets near offsets 3nL, . . . are used as entries.

13. A data compression method according to claim 12, wherein when the input data is image data, L which defines an offset is a line length of the input image data.

14. A data compression method according to claim 12, wherein when the input data is image data, L which defines an offset is a line length of the input image data, and when a transfer source of the input data is a memory, a readout order (order to supply addresses) is set to a head of a $0^{th}$ line, a head of a first line, . . . , a head of an nth line, the next of the $0^{th}$ line, the next of the first line, . . . , the next of the nth line, . . .

and processing is done by a pre-processing unit corresponding to a readout unit.

15. A data compression method for compressing an input data stream and outputting the encoded stream, comprising the steps of:

storing encoded input data in a moving window having a predetermined size;

comparing a partial sequence starting from a given position (entry) in the moving window with a data sequence to be encoded by a plurality of comparators;

finding an entry having a maximum matching length by a matching finder in comparison by the plurality of comparators;

encoding a pair of offsets up to the entry and a matching length (offsets and matching length) by a matching code generator when matching is found by the matching finder, wherein the number of comparators is smaller than the size of the moving window, and at least one of offsets near offset 0 (0 indicates including no offset) and near offset L are used as entries;

rearranging by a pre-processing unit a byte order of an input data stream:

0, 1, 2, 3, . . . , L, . . . (L is a rearrangement cycle, L=p×q, p and q are integers not less than 2) into

| |
|---|
| 0, p, 2p, . . . , (q−1)p |
| 1, p+1, 2p+1, . . . , (q−1)p+1 |
| 2, p+2, 2p+2, . . . , (q−1)p+2 |
| . . . |
| p−1, p+[1]p−1, 2p+p−1, . . . , (q−1)p+p−1; and | compressing the input data stream rearranged by the pre-processing unit and outputting the encoded stream by a compression apparatus main body.

16. A data compression method for compressing an input data stream and outputting the encoded stream, comprising the steps of:

storing encoded input data in a moving window having a predetermined size;

comparing a partial sequence starting from a given position (entry) in the moving window with a data sequence to be encoded by a plurality of comparators;

finding an entry having a maximum matching length by a matching finder in comparison by the plurality of comparators;

encoding a pair of offsets up to the entry and a matching length (offsets and matching length) by a matching code generator when matching is found by the matching finder, wherein the number of comparators is smaller than the size of the moving window, and at least one of offsets near offset 0 (0 indicates including no offset) and near offset L are used as entries;

rearranging by a pre-processing unit a byte order of an input data stream:

0, 1, 2, 3, . . . , L, into 0, 2, 4, . . . , L−2, 1, 3, 5, . . . , L−1, . . . (L is an even number) or 0, 2, 4, . . . , L−1, 1, 3, 5, . . . , L−2, . . . (L is an odd number); and compressing the input data stream rearranged by the pre-processing unit and outputting the encoded stream by a compression type compression apparatus.

17. A data compression method for compressing an input data stream and outputting the encoded stream, comprising the steps of:

storing encoded input data to a moving window having a predetermined size;

comparing a partial sequence starting from a given position (entry) in the moving window with a data sequence to be encoded by a plurality of comparators;

finding an entry having a maximum matching length by a matching finder in comparison by the plurality of comparators; and encoding a pair of offsets up to the entry and a matching length (offsets and matching length) by a matching code generator when matching is found by the matching finder, wherein the number of comparators is smaller than the size of the moving window, and at least one of offsets near offset 0 (0 indicates including no offset) and near offset L are used as entries.

18. A data compression method according to claim 17, characterized in that L which defines an offset is an externally supplied parameter.

19. A data compression method according to claim 17, wherein when the input data is image data, L which defines an offset is a line length of the input image data.

20. A data compression method according to claim 17, wherein L which defines an offset is an externally supplied parameter, and offsets M, where M is an externally supplied parameter and M<L, and L±M are respectively employed as offsets near offset 0, and near offset L.

21. A data compression method according to claim 17, wherein when the input data is image data of pixels each having n bytes, n being an integer not less than 2, L which defines an offset is an externally supplied parameter, and offsets M, where M=n and M<L, and L±M are respectively employed as offsets near offset 0 and near offset L.

22. A data compression method according to claim 17, wherein when the input data is a dot image or centralized dither image having an interval of n bytes between dots in a main scanning direction or between peaks in a centralized dither, L which defines an offset is a line length of the input image data, and offsets M and L±M are respectively employed as offsets near offset 0 and near offset L.

23. A data compression method according to claim 17, wherein when the input data is image data of pixels each having m bits, m being a natural number which cannot be divided by 8, L which defines an offset is an externally supplied parameter, and offsets M, where M=a least common multiple of m and 8 and M<L, and L±M are respectively employed as offsets near offset 0 and near offset L.

24. A data compression method according to claim 17, wherein when the input data is a dot image or centralized dither image having an interval of m bits, where m is a natural number which cannot be divided by 8, between dots in a main scanning direction or between peaks in a centralized dither, L which defines an offset is a line length of the input image data, and offsets M, wherein M=a least common multiple of m and 8 and M<L, and L±M are respectively employed as offsets near offset 0 and near offset L.

25. A data compression method for compressing an input data stream and outputting the encoded stream, comprising the steps of:

storing encoded input data in a moving window having a predetermined size;

comparing a partial sequence starting from a given position (entry) in the moving window with a data sequence to be encoded by a plurality of comparators;

finding an entry having a maximum matching length by a matching finder in comparison by the plurality of comparators;

encoding a pair of offsets up to the entry and a matching length (offsets and matching length) by a matching code generator when matching is found by the matching finder, wherein the number of comparators is smaller than the size of the moving window, and at least one of offsets near offset 0 (0 indicates including no offset) and near offset L are used as entries;

rearranging by a pre-processing unit an order of m-bit bytes (m=p×q; p is an integer not less than 1 and q is an integer not less than 2) of the input data stream:

```
First Line: 0, 1, 2, . . . ,
Second Line: L, L+1, L+2, . . . ,
```

```
. . .           . . .
qth Line: (q−1)L, (q−1)L+1, (q−1)L+2, . . . , qL−1
```
into
```
a new first byte made up of m bits:
0 : b(0), . . . , 0 : b(p−1),
L : b(0), . . . , L : b(p−1),
. . .           . . .
(q−1)L : b(0), . . . , (q−1)L : b(p−1)
a new second byte made up of m bits:
0 : b(0), . . . , 0 : b(2p−1),
L : b(0), . . . , L : b(2p−1),
. . .           . . .
(q−1)L : b(0), . . . , (q−1)L : b(2p−1)
. . .           . . .
a new qth byte made up of m bits:
0 : b((q−1)p), . . . , 0 : b(qp−1),
L : b((q−1)p), . . . , L : b(q2p−1),
. . .           . . .
(q−1)L : b((q−1)p), . . . , (q−1)L : b(q2p−1)
a new (q+1)th byte made up of m bits:
1 : b(0), . . . , 1 : b(p−1),
L+1 : b(0), . . . , L+1 : b(p−1),
. . .           . . .
(q−1)L+1 : b(0), . . . , (q−1)L+1 : b(p−1)
. . .           . . .
a new (q+2)th byte made up of m bits:
1 : b(p), . . . , 1 : b(2p−1),
L+1 : b(p), . . . , L+1 : b(2p−1),
. . .           . . .
(q−1)L+1 : b(p), . . . , (q−1)L+1 : b(2p−1)
. . .           . . .
a new 2qth byte made up of m bits:
1 : b((q−1)p), . . . , 1 : b(qp−1),
L+1 : b((q−1)p), . . . , L+1 : b(q2p−1),
. . .           . . .
(q−1)L+1 : b((q−1)p), . . . , (q−1)L+1 : b(q2p−1)
. . .           . . .
``` wherein the first, second, . . . , mth bits within a byte are respectively represented by b(0), b(1), . . . , b(m−1), and left and right sides of "0: b(0)" respectively represent the byte order of an input stream and a bit in the byte; and compressing the input data stream rearranged by the pre-processing unit and outputting the encoded stream by a compression type compression apparatus main body.

\* \* \* \* \*